(12) United States Patent
Wilson et al.

(10) Patent No.: US 7,250,825 B2
(45) Date of Patent: Jul. 31, 2007

(54) METHOD AND APPARATUS FOR CALIBRATION OF A LOW FREQUENCY OSCILLATOR IN A PROCESSOR BASED SYSTEM

(75) Inventors: Brent Wilson, Austin, TX (US); Paul Highley, Austin, TX (US); Kenneth W. Fernald, Austin, TX (US)

(73) Assignee: Silicon Labs CP Inc., Austin, TX (US)

( * ) Notice: Subject to any disclaimer, the term of this patent is extended or adjusted under 35 U.S.C. 154(b) by 0 days.

(21) Appl. No.: 10/865,110

(22) Filed: Jun. 10, 2004

(65) Prior Publication Data
US 2005/0270108 A1    Dec. 8, 2005

Related U.S. Application Data

(60) Provisional application No. 60/577,314, filed on Jun. 4, 2004.

(51) Int. Cl.
*G01R 23/10* (2006.01)
*H03I 1/00* (2006.01)

(52) U.S. Cl. ............................. 331/44; 331/74; 331/175

(58) Field of Classification Search .................. 331/44, 331/74, 175
See application file for complete search history.

(56) References Cited

U.S. PATENT DOCUMENTS

| 5,243,302 | A | * | 9/1993 | Camp et al. | 331/16 |
|---|---|---|---|---|---|
| 5,525,936 | A | * | 6/1996 | Post et al. | 331/47 |
| 5,767,747 | A | * | 6/1998 | Pricer | 331/46 |
| 6,545,550 | B1 | * | 4/2003 | Frerking | 331/44 |

* cited by examiner

*Primary Examiner*—Robert Pascal
*Assistant Examiner*—James Goodley
(74) *Attorney, Agent, or Firm*—Howison & Arnott, L.L.P.

(57) ABSTRACT

Method and apparatus for calibration of a low frequency oscillator in a processor based system. A method for calibrating an on-chip non-precision oscillator. An on-chip precision oscillator is provided having a known frequency of operation that is within an acceptable operating tolerance. The on-chip precision oscillator is used as a time base and then the period of the on-chip oscillator is measured as a function of the time base. The difference between the measured frequency of the on-chip non-precision oscillator and a desired operating frequency of the on-chip non-precision oscillator is then determined. After the difference is determined, the frequency of the on-chip non-precision oscillator is adjusted to minimize the determined difference.

7 Claims, 6 Drawing Sheets

METHOD AND APPARATUS FOR CALIBRATION OF A LOW FREQUENCY OSCILLATOR IN A PROCESSOR BASED SYSTEM

CROSS-REFERENCE TO RELATED APPLICATIONS

This Application is claims benefit of Provisional application Ser. No. 60/577,314, filed on Jun. 4, 2004, "METHOD AND APPARATUS FOR CALIBRATION OF A LOW FREQUENCY OSCILLATOR IN A PROCESSOR BASED SYSTEM"

TECHNICAL FIELD OF THE INVENTION

The present invention pertains in general to oscillators for use in a processor-based system and, more particularly, to a calibration system for calibrating the oscillator.

BACKGROUND OF THE INVENTION

Processor-based systems require a time base in order to operate. This time base can either be an external time base or an internal time base. The time base provides a clock signal that is utilized by the processor-based system to execute various instructions, run internal timers and provide sample clocks to data conversion systems such as analog-to-digital converters and digital-to-analog converters. In some applications, the processor is able to operate at two clock frequencies, a high clock frequency and a low clock frequency. The reason for operating at the low clock frequency is to conserve power when placed in a low power mode or "sleep mode." However, if the high frequency clock, which is typically a crystal controlled clock, is operated in the low power mode by utilizing a divider, the power consumed by the high frequency oscillator may still be a factor in overall power consumption. To address this problem, some systems provide for a high frequency oscillator for operating in the high frequency mode and a separate low frequency oscillator for operating in the low frequency mode. With the low frequency oscillator, this is typically fabricated with an RC oscillator with no crystal, which both conserves power and eliminates the need for an expensive external component such as the crystal. However, this type of oscillator drifts with respect to temperature and must be re-calibrated at start-up due to the fact that the frequency thereof varies as a function of manufacturing tolerances due to fabrication process variations. As such, some type of calibration procedure must be performed if it is desired to have a known frequency of operation during low power operation. This is required when a part, when operating in the sleep mode, requires certain known timed events to occur, such as "waking up" after a predetermined amount of time has elapsed.

SUMMARY OF THE INVENTION

The present invention disclosed and claimed herein, in one aspect thereof, comprises a method for calibrating an on-chip non-precision oscillator. An on-chip precision oscillator is provided having a known frequency of operation that is within an acceptable operating tolerance. The on-chip precision oscillator is used as a time base and then the period of the on-chip oscillator is measured as a function of the time base. The difference between the measured frequency of the on-chip non-precision oscillator and a desired operating frequency of the on-chip non-precision oscillator is then determined. After the difference is determined, the frequency of the on-chip non-precision oscillator is adjusted to minimize the determined difference.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
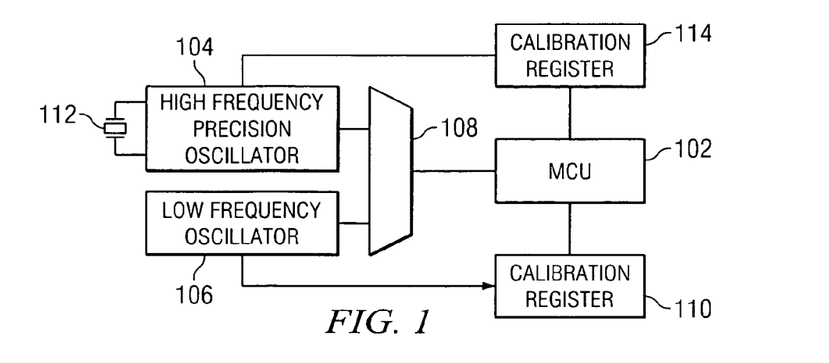
FIG. 1 illustrates a block diagram for the processor-based system utilizing high frequency and low frequency oscillators.

Referring now to FIG. 1, there is illustrated a diagrammatic view of a processor-based system illustrating the calibratable oscillator section. The processor-based system is comprised primarily of a central processing unit 102 which, in this example, is a micro-controller unit (MCU). This is a conventional device which is comprised of a plurality of functional blocks, such as a processor, a digital I/O and analog-to-digital conversion circuitry. Circuits of this type are typically referred to as system on a chip devices of the type manufactured by Silicon Laboratories, Inc., part No. C8051FXXX. These devices typically include one or more selectable oscillators. In this example, there is illustrated a high frequency precision oscillator 104 and a low frequency oscillator 106. Each of the oscillators provides an output to a multiplexer circuit 108 which drives the operation of the MCU 102. The low frequency oscillator 106 is not crystal controlled and, therefore, is adjustable. There is provided a calibration register 110 for the low frequency oscillator 106 that allows for adjusting the frequency thereof. The high frequency precision oscillator 104 has a mode that does not utilize a crystal 112 and, therefore, it can be adjusted through the use of calibration information in a calibration register 114, which will be described in more detail herein below. Also, as will be described herein below, the high frequency precision oscillator 104 can be turned off to save power such that the MCU 102 will run primarily based upon timing information received from the low frequency oscillator 106 that draws less power and, also, since the MCU 102 is clocked at a lower frequency, the MCU 102 will draw considerably less power. This will provide operation in low power mode, this being a conventional mode of operation.

Figure 2:
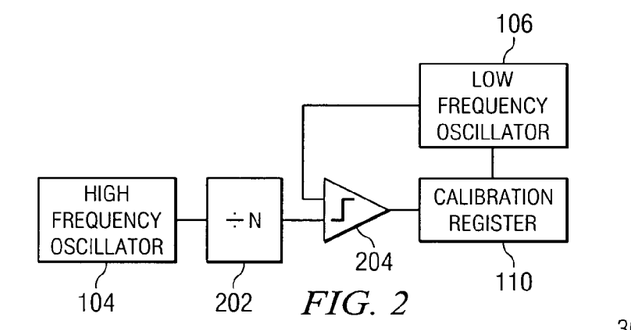
FIG. 2 illustrates a diagrammatic view of a calibration operation of the low frequency oscillator.

Referring now to FIG. 2, there is illustrated a diagrammatic view of the calibration operation of the low frequency oscillator. Typically, the low frequency oscillator 106 will be calibrated by the user when the user receives the integrated circuit, or it could be calibrated at the factory to a desired frequency. Since the low frequency oscillator 106 is not crystal controlled, the center frequency thereof will vary as a function of temperature and of manufacturing tolerances. Thus, if the low frequency oscillator 106 is designed to be an 80 kHz nominal frequency clock circuit, the manufacturing tolerances could cause this to vary at room temperature by as much as +/−20%. Thus, there must be some adjustment at room temperature. Even so, the center frequency will vary over temperature, depending upon the temperature coefficient of the components associated therewith. Thus, the calibration register 110 provides for calibration thereof. However, a stable oscillator must be used as a time base. The calibration procedure of the present disclosure, the on-chip high frequency oscillator 104, is utilized to provide this time base. Essentially, the high frequency oscillator 104 (or a divided down representation thereof) has the number of clock cycles thereof counted between rising edges of a low frequency oscillator 106 to determine the period of the low frequency oscillator as a function of the frequency of the high frequency oscillator 104. A divide circuit 202 is utilized to lower the frequency of the high frequency oscillator 104 such that a lower number of clock cycles are required to be counted. A comparison is made between the rising edges of the low frequency oscillator 106 and the output of the divide circuit 202 by a device 204 for use in determining the calibration value. This device 204 is representative of a software operation that is carried out by a timing circuit in the MCU 102, as will be described in more detail herein below.

Figure 3:
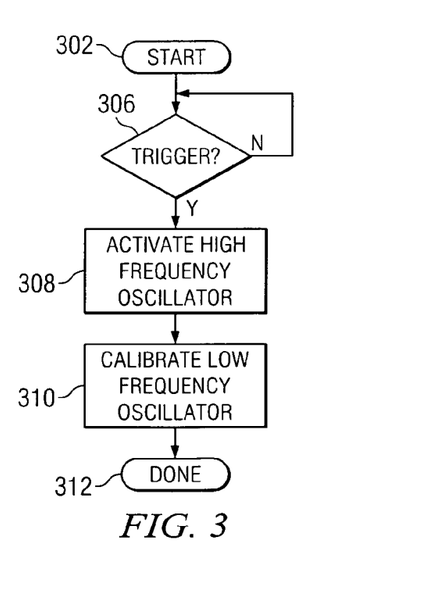
FIG. 3 illustrates an overall flow chart for the calibration operation.

Referring now to FIG. 3, there is illustrated a flow chart for the general operation involved in calibrating the low frequency oscillator 106. In this operation, the program is initiated at a block 302 and then proceeds to a decision block 306. The decision block 306 determines if a trigger operation has occurred, i.e., has there been an event that would cause the calibration operation to be initiated. In the disclosed embodiment, one trigger operation is a "reset" operation that has occurred such as power-up reset. Upon powering up of the part, an initialization process will occur for the MCU 102 for various reasons other than calibration. During this reset or initialization operation, one procedure will be to calibrate the low frequency oscillator 106. Additionally, there can be set in the MCU 102 predetermined time intervals wherein the low frequency oscillator 106 would be calibrated through the use of an internally generated reset signal. Another trigger event could be temperature. The MCU 102 contains a band gap generator circuit for providing a very stable voltage and temperature independent voltage, but it also provides a temperature reference. Thus, the MCU 102 can determine the temperature of the integrated circuit on which it is fabricated and, thereby, provide an output measurement of temperature. When the temperature varies by a certain amount, this being independent of the frequency of the low frequency oscillator 106 from which the MCU 102 operates, a trigger event can be recorded. Once this trigger event has been recorded, when a temperature has been changed by more than a certain delta temperature value, then a new calibration operation can be effected to ensure that any drift of the low frequency oscillator is accounted for. Thus, the MCU 102 can maintain a dynamic calibration relative to temperature or some other parameter.

Since the MCU 102 has an analog input which is converted through the use of analog-to-digital converters to a digital value, the MCU 102 can be interfaced with various sensors. It may be that there is some sensed aspect of the environment that would cause the low frequency oscillator 106 to require additional calibration as a function thereof. In any event, once the trigger event occurs, the program will flow along the "Y" path to a function block 308 to activate the high frequency oscillator, if the high frequency oscillator is turned off to conserve power. This will provide the high frequency reference or the stable reference that has a known frequency versus temperature, and then the program flows to a function block 310 to calibrate the low frequency oscillator. The program will then flow to a DONE block 312.

Figure 4:
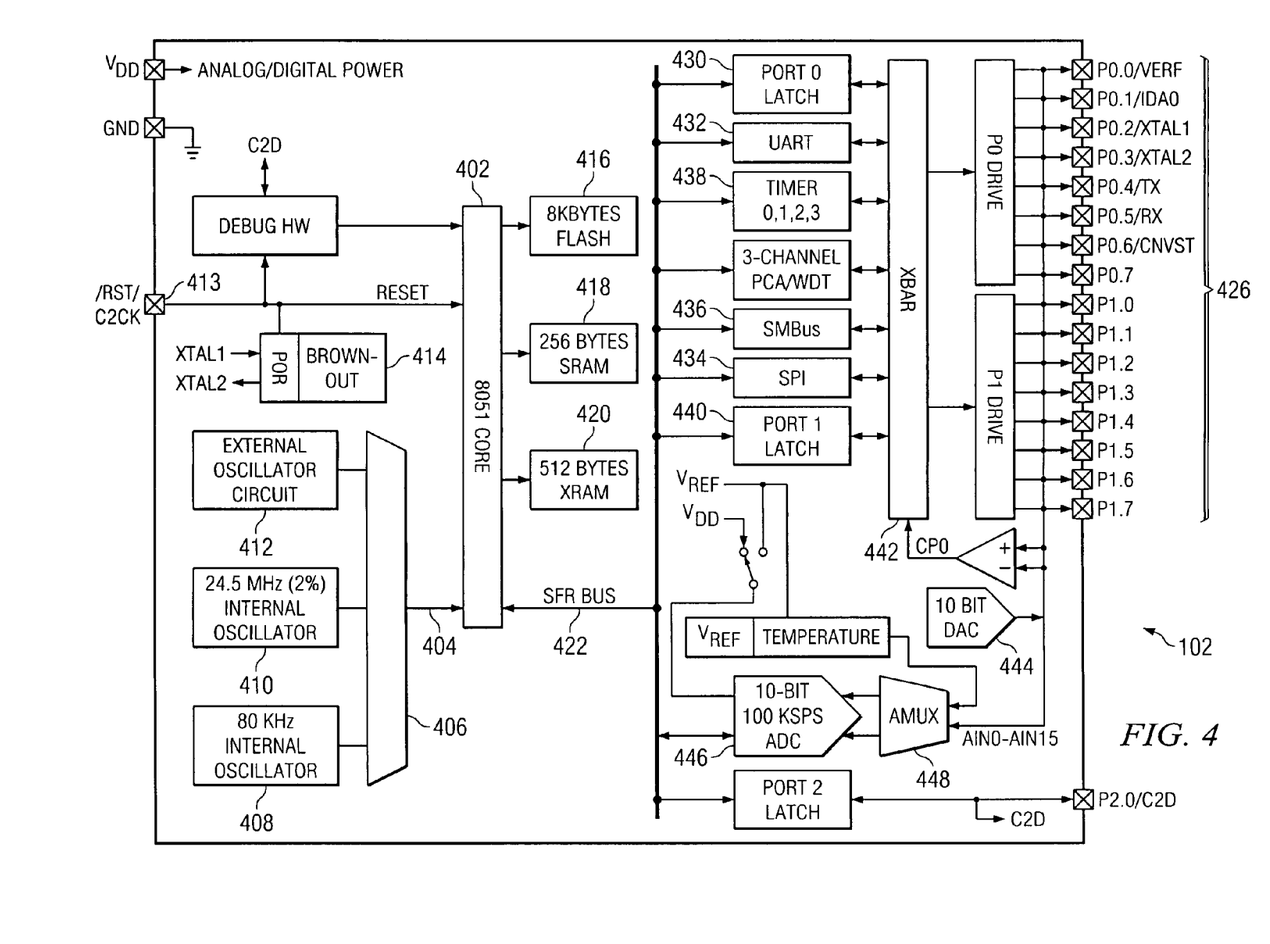
FIG. 4 illustrates a logic diagram for the processor-based system.

Referring now to FIG. 4, there is illustrated a block diagram of the MCU 102. As noted herein above, this is a conventional operation of, for example, a part number C8051F330/1 manufactured by Silicon Laboratories Inc. The MCU 102 includes in the center thereof a processing core 402 which is typically comprised of a conventional microprocessor of the type "8051." The processing core 402 receives a clock signal on a line 404 from a multiplexer 406. The multiplexer 406 is operable to select among multiple clocks. There is provided an 80 kHz internal oscillator 408, a 24.5 MHz trimmable internal precision oscillator 412 or an external crystal controlled oscillator 410. The precision internal oscillator 412 is described in U.S. patent application Ser. No. 10/244,344, entitled "PRECISION OSCILLATOR FOR AN ASYNCHRONOUS TRANSMISSION SYSTEM," filed Sep. 16, 2002, which is incorporated herein by reference. The processing core 402 is also operable to receive an external reset on terminal 413 or is operable to receive the reset signal from a power-on-reset block 414, all of which provide a reset to processing core 402. This will comprise one of the trigger operations. The processing core 402 has associated therewith a plurality of memory resources, those being either flash memory 416, SRAM memory 418 or random access memory 420. The processing core 402 interfaces with various digital circuitry through an on-board digital bus 422 which allows the processing core 402 to interface with various operating pins 426 that can interface external to the chip to receive digital values, output digital values, receive analog values or output analog values. Various digital I/O circuitry are provided, these being latch circuitry 430, serial port interface circuitry, such as a UART 432, an SPI circuit 434 or an SMBus interface circuit 436. Three timers 438 are provided in addition to another latch circuit 440. All of this circuitry 430-440 is interfacable to the output pins 426 through a crossbar device 442, which is operable to configurably interface these devices with select ones of the outputs. The digital input/outputs can also be interfaced to a digital-to-analog converter 444 for allowing a digital output to be converted to an analog output, or to the digital output of an analog-to-digital converter 446 that receives analog input signals from an analog multiplexer 448 interfaced to a plurality of the input pins on the integrated circuit. The analog multiplexer 448 allows for multiple outputs to be sensed through the pins 426 such that the ADC can be interfaced to various sensors. Again, the MCU 102 is a conventional circuit.

Figure 5:
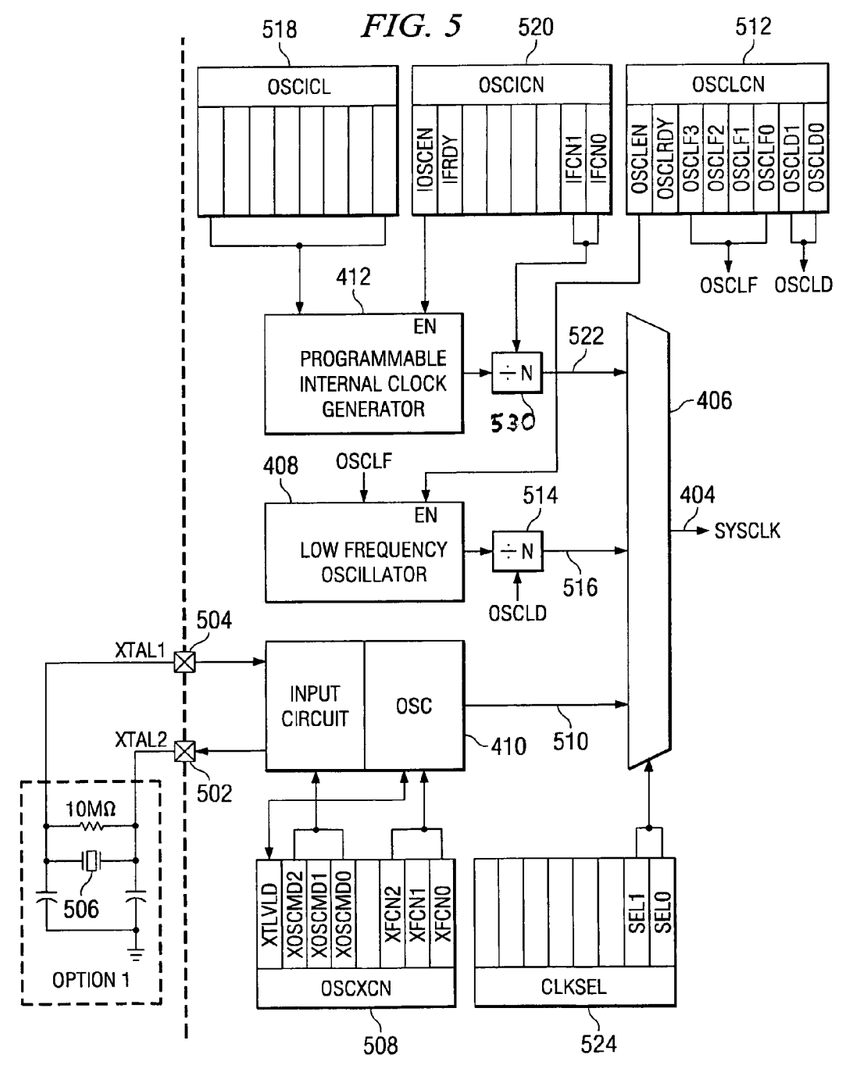
FIG. 5 illustrates a logic diagram of the oscillator.

Referring now to FIG. 5, there is illustrated a schematic diagram of the oscillator section comprised of the oscillators 408, 410 and 412 and the multiplexer 406. The oscillator 410 is a crystal controlled oscillator that is interfaced through two external terminals 502 and 504 to an external crystal 506 and operates up to frequencies in excess of 25 MHz. A register 508 is provided, labeled OSCXCN, which is operable to drive control signals for the oscillator 410 and to record output values thereof. The output of the oscillator 410 is provided on a line 510 to one input of the multiplexer 406.

The low frequency oscillator 408 is controlled by a register 512, labeled OSCLCN, which provides calibration bits OSCLF which are input thereto, which set the frequency thereof. The output of the low frequency oscillator 408 is input to a divide circuit 514 which is controlled by the register 512 to provide a variable divide ratio. The resulting frequency is output on a line 516 to another input of the multiplexer 406. The programmable precision trimmable oscillator 412 is controlled by a register 518 and a register 520 to control the operation thereof, i.e., to both set the frequency thereof and to enable this oscillator. The output of the oscillator 412 is processed through a divide circuit 530, the divide ratio thereof set by bits in the register 520 to provide on an output 522 a precision high frequency clock to another input of the multiplexer 406. The output of the multiplexer 406 is provided to the MCU 102 on the clock line 404 as a system clock signal SYSCLK. The clock select operation is facilitated with a register 524 labeled CLKSEL, which controls the multiplexer 406.

The programmable high frequency oscillator 412 is the default clock after a system reset. The values in the register 518, labeled OSCICL, provide bits that are typically programmed at the factory, these bits stored in the flash memory. The center frequency of the high frequency clock, as described herein above, is 24.5 MHz. The divide circuit 530 can provide a divide ratio of one, two, four or eight. The oscillator 412, in the C8051F330 device by way of example only, is a +/−2 percent accuracy oscillator which has a center frequency that, although programmed at the factory, is allowed to be adjusted by changing the bits in the register 518. There are provided seven bits in the register 518 that are calibratable bits. The register 520 provides an enable bit for the oscillator 412 and a bit that determines if the oscillator 412 is running at the programmed frequency. Two bits in the register 520 are utilized to set the divide ratio of the divider 530.

The low frequency oscillator 408 is, as described herein above, operable to be calibrated to a nominal frequency of 80 kHz. The register 512 is comprised of eight bits. The first two bits, bits 0 and 1, OSCLD [1:0], provide a two bit value to set the divide ratio of the divider 514 to one, two, four or eight. Bits 5-2, OSCLF [3:0], are the internal frequency control bits. These are the fine-tuned control bits for defining the frequency of the internal oscillator 408. When set to 0000b, the low frequency oscillator operates at the fastest setting. When set to 1111b, the low frequency oscillator operates at its slowest setting. Bit 6 provides the OSCLRDY signal that represents whether the frequency is stabilized or not stabilized. Bit 7 is the oscillator enable signal OSCLEN, which either enables or disables the oscillator. These bits to the register 512 can be written from the MCU or external thereto to provide status information for the low frequency oscillator 408 or control information for controlling the operation thereof.

The low frequency oscillator is calibrated using functions of the timers 438, as will be described herein below. The timers 438 include capture functions that can be used to capture the oscillator period, when the timers are running from a known time base. When the timer 438 is configured for a low frequency oscillator capture mode, a falling edge or a rising edge, depending upon how the timers 438 are configured, causes the low frequency oscillator's output to effect a capture event on the corresponding timer. As the capture event occurs, a current timer value is then copied into a timer reload register and then the MCU 102 is able to record a difference between two successive timer capture values in order to calculate the period of the low frequency.

The OSCLF bits can then be adjusted to produce the desired oscillator period. In the present embodiment, the oscillator period can be tuned in steps of approximately 3%, it being recognized that a higher level of fine tuning could be provided with different circuitry. The equation for the adjustment of the frequency is as follows:

$$\Delta T \cong 0.03 \times \frac{1}{f_{BASE}} \times \Delta OSCLF$$

Figure 6A:
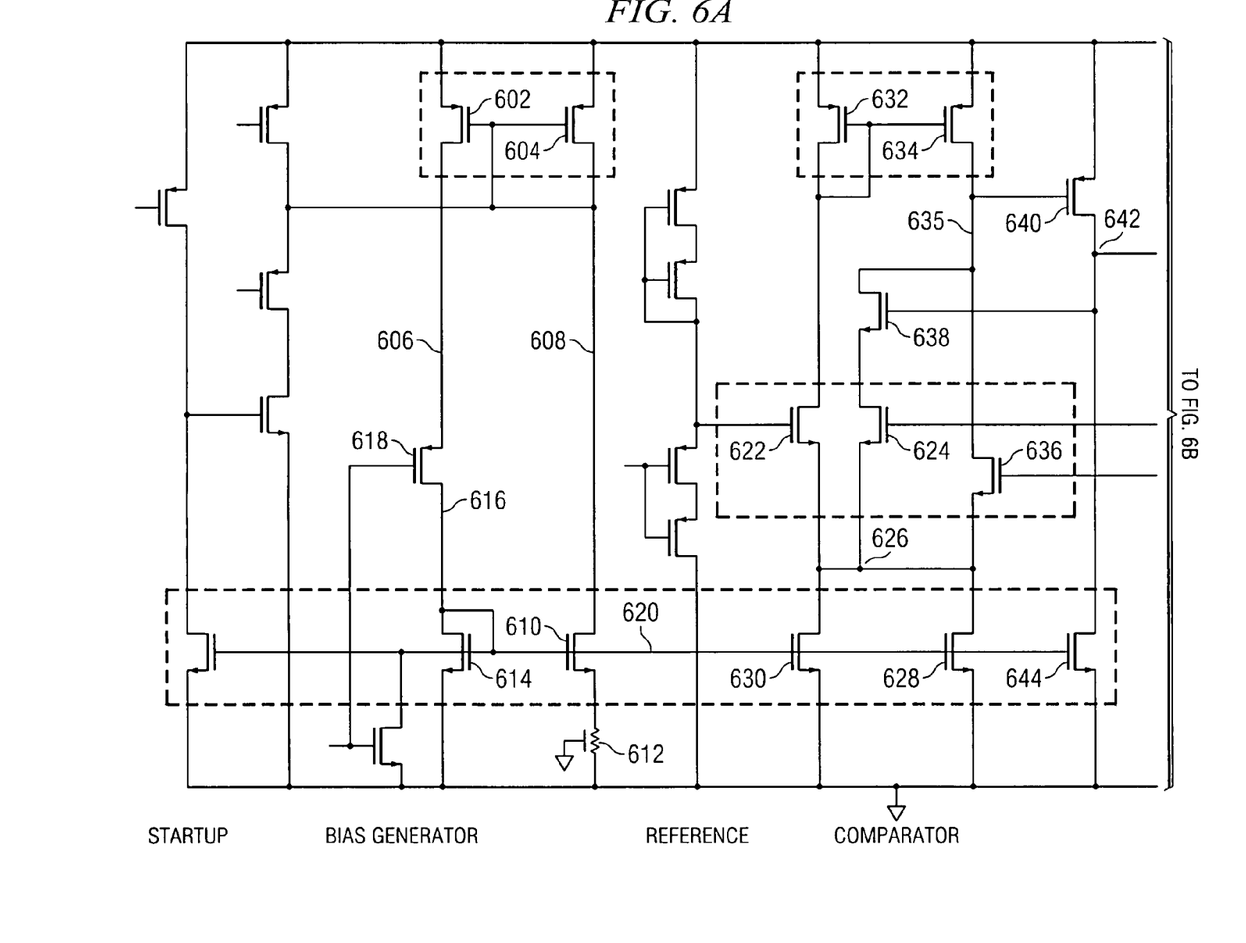
FIG. 6 illustrates a schematic diagram of the low frequency oscillator.
Figure 6B:
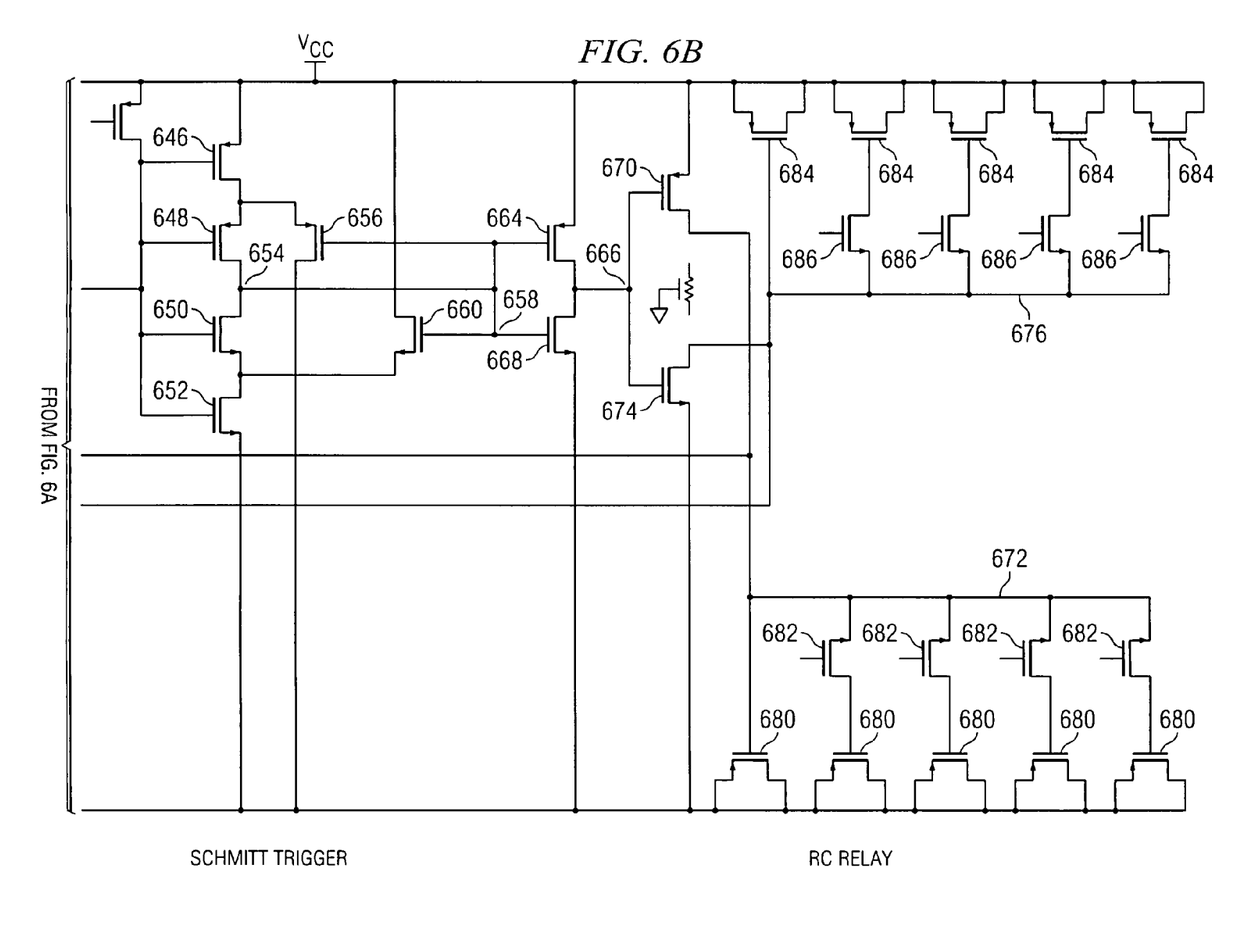

Referring now to FIG. 6, there is illustrated a schematic diagram of the low frequency oscillator 408. A bias circuit is comprised of two p-channel transistors 602 and 604, transistor 602 having the source/drain path thereof connected between a power supply node and a node 606, and transistor 604 having the source/drain path thereof connected between the power supply terminal and a node 608. The gates of transistor 602 are connected together with the gate of transistor 604 connected to node 608 in a diode-configured manner. Node 608 is connected to one side of an n-channel transistor 610, the other side thereof connected trough a resistor 612 to ground. The gate of transistor 610 is connected to the gate of an n-channel transistor 614, transistor 614 having the source/drain path thereof connected between ground and a node 616, node 616 connected to the gate of transistor 614 such that transistor 614 is a diode-configured device. Node 616 is connected to node 606 through source/drain path of a p-channel transistor 618, the gate thereof connected to a start-up control signal labeled "OFF." Once the oscillator is started up, this signal will be low. Therefore, a bias voltage will be maintained on a node 620, to which the gates of transistor 610 and 614 are connected.

A comparator is provided which is comprised of two differential connected n-channel transistors 622 and 624, both having one side thereof connected to a common source node 626. Node 626 is connected to one side of two n-channel transistors 628 and 630, the other side thereof connected to ground and the gates thereof connected to node 620. Transistor 622 has the other side of the source/drain path thereof connected to one side of a diode-configured p-channel transistor 632, the other side thereof connected to the power supply and the gate thereof connected to the gate of a p-channel transistor 634. Transistor 634 has the source/drain path thereof connected between the power supply node and one side of an n-channel transistor 636 on a node 635, the other side of the transistor 636 connected to the common source node 626. The other side of the transistor 624 is connected to one side of the source/drain path of an n-channel transistor 638, the other side thereof connected to the node 635. The node 635 is connected to the gate of a p-channel transistor 640, the source/drain path thereof connected between the power supply node and a node 642. The node 635 provides a first output from the comparator, the transistor 640 providing a source follower configuration for driving the node 640 in order to provide a second output. Node 642 is connected to one side of the source/drain path of an n-channel transistor 644, the other side thereof connected to ground and the gate thereof connected to the bias node 620. Node 642 drives the gates of two series connected p-channel transistors 646 and 648 and the gates of two series connected n-channel transistors 650 and 652. Transistors 646 and 648 have the source/drain paths thereof connected in series and between the power supply node and a node 654.

The node 654 provides a third output of the comparator, the transistors 646 and 648 and the transistors 650 and 652 being part of a Schmitt trigger. The source/drain paths of transistors 646 and 648 are connected at the intersection thereof to one side of the source/drain path of a p-channel transistor 656, the other side thereof connected to ground and the gate thereof connected to a node 658. The intersection of the source/drain paths of transistors 650 and 652 are connected to one side of the source/drain path of an n-channel transistor 660, the other side thereof connected to the power supply node and the gate thereof connected to the node 658. Node 658 drives the gate of a p-channel transistor 664, the source/drain thereof connected between the power supply and a node 666, the node 666 providing a fourth output of the comparator. The node 658 is connected to the gate of an n-channel transistor 668, the source/drain path thereof connected between the node 666 and ground. Node 666 drives the gate of a driver p-channel transistor 670, which drives a node 672 from the power supply. The gate of the node 666 is also connected to the gate of an n-channel driver transistor 674, which is operable to drive a node 676. Node 672 is connected to the gate of transistor 624 and the node 676 is connected to the gate of transistor 636. Node 672 is connected to a plurality of selectable capacitors, which are configured of n-channel transistors 680, with the gates thereof interfaced to node 672 and the source/drains thereof connected together and to ground. One of the transistors 680 has the gate thereof connected directly to node 672, and the gates of the other of the transistors 680 are selectively connected thereto with selection p-channel transistors 682. Each of the transistors 682 is controlled by the oscillator configuration bits from register 512. Similarly, node 676 is interfaced to one side of a plurality of selectable capacitors, the other side thereof connected to the supply node, the capacitors configured of p-channel transistor 684 having the gates thereof interfaced to node 676 either directly or selectively, and the source/drains thereof connected together and to the power supply node. The gate of one of the transistors 684 is connected directly to node 676 and the gates of the other transistors 684 are selectively connected to node 676 through n-channel transistors 686, which are controlled with the configuration bits in the register 512.

Figures 7, 8:
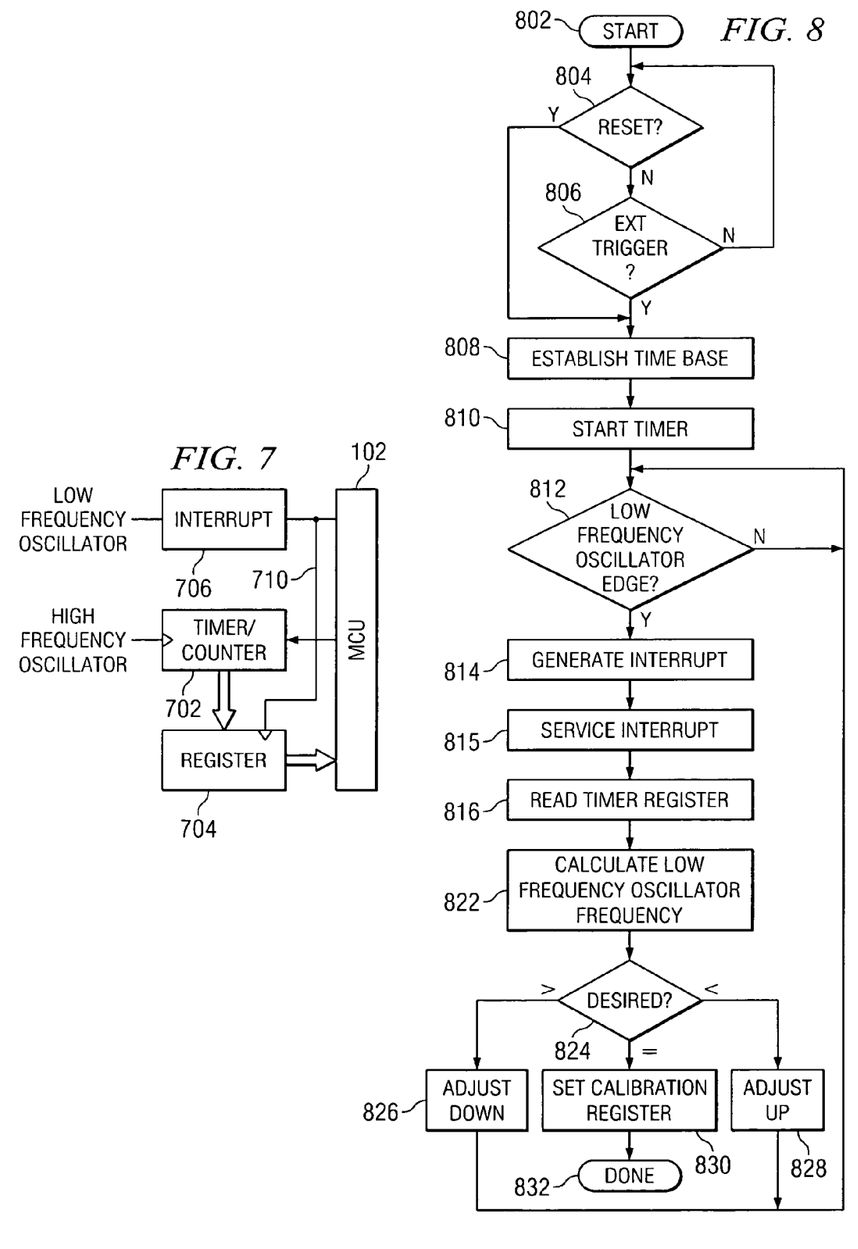
FIG. 7 illustrates a logic diagram for one of the timers.
FIG. 8 illustrates a detailed flow chart for the calibration operation.

Referring now to FIG. 7, there is illustrated a flow chart depicting a block diagram of the timer/counter operation that is operable to capture a timer value at each edge of the low frequency clock. The high frequency oscillator is provided as a clock input for timer/counter 702. This timer/counter 702 will count the edges of the high frequency clock (or a divided down representation thereof) on a continual basis. This clock will overflow at maximum count. In the disclosed embodiment, this is a 16-bit counter. The contents of the timer/counter 702 can be stored in a register 704 in response to the receipt of the transfer signal on a line 710. The low frequency oscillator output is input to an interrupt block 706 which generates an interrupt to the MCU and which also causes the contents of the timer to be transferred to register 704. Therefore, whenever the appropriate edge, either falling or rising (there only being one that generates the interrupt), is generated, the interrupt will be provided to the MCU and will also cause the contents of the timer/counter 702 to be transferred to register 704. The timer/counter 702 continues to count, and the MCU is allowed time to service the interrupt and transfer the contents of the register 704 over to the MCU for processing thereof, as will be described herein below.

Referring now to FIG. 8, there is illustrated a flow chart for the calibration operation. This is initiated at a block 802 and then proceeds to a decision block 804 to determine if a reset has been received. If not, the program flows to a decision block 806 to determine if an external trigger has occurred such as a user calibrate input or a calibrate signal from another source that provides an interrupt for this operation. If decision block 806 determines that an external trigger indicating that a request for a calibration operation has been received or if a reset has been received, the program flows from either of decision blocks 804 or 806 to a function block 808 to establish a time base to which calibration is to be made. As described herein above, this time base is the output of the precision oscillator or the external crystal controlled oscillator. When the calibration is initiated, if the system is operating in the low power mode, it may be necessary to turn on the high frequency oscillator, as it may be powered down for power conservation purposes, or it may be that all that is required is selection of the output of the already running high frequency oscillator. In any event, this high frequency oscillator will provide the time base, a known frequency, to which the low frequency clock is calibrated. However, if either a reset signal or an external trigger signal is not received, the program will flow along the "N" path back to the input of decision block 804.

Once the reset or trigger has been received and a time base established, the program flows to a function block 810 wherein the timer is started. This timer is clocked by the high frequency clock (possibly a divided down clock) to count the pulses associated therewith. It is noted that these pulses are at a frequency that is higher than that of the low frequency clock. The program then flows to a decision block 812 to determine if the low frequency oscillator edge has occurred. This could either be a falling edge or a rising edge, depending upon how the timer is configured. However, it will only look for either a falling edge or a rising edge. When the particular edge occurs, the program flows along a "Y" path to a function block 814 wherein an interrupt is generated. This interrupt is input to the MCU. Additionally, the interrupt operation will also cause the data or the value of the register to be transferred to the register 704. Of course, the timer 702 continues to count. The program then flows to a function block 813 wherein the MCU will service the interrupt. During servicing of this interrupt, the program will flow to a function block 816 wherein the contents of the register 704 will be read. The program then flows to a function block 822 wherein the currently read value from the register 704 is compared to a previously read value. With two successive values for two successive rising (or falling) edges of the low frequency clock, the period of the low frequency clock can be calculated. This is indicated at a function block 822. The program then flows to decision block 824 to determine if the calculated frequency is at the desired frequency. If it is greater than the desired frequency, the program flows to a function block 826 to increment the value downward and then flows back to the input of decision block 812 to await the next low frequency oscillator edge. If it is less than the desired frequency, the program flows to a function block 828 to adjust the value incrementally upwards, and then back to the input of the decision block 812. If the desired value has been achieved, the program flows to a function block 830 to set the calibration register value and then to a Done block 832. As noted herein above, the increments are in 3% increments of frequency. However, it could be that a look-up table is provided that would allow the calculation to be facilitated in a single step rather than iteratively. This, of course, would require characterization of the oscillator and storage of a characterization information in Flash.

Although the preferred embodiment has been described in detail, it should be understood that various changes, substitutions and alterations can be made therein without departing from the spirit and scope of the invention as defined by the appended claims.

What is claimed is:

1. A method for calibrating an on-chip non-precision oscillator, comprising the steps of:
   providing an on-chip precision oscillator having a known frequency of operation that is within an acceptable operating tolerance;
   using the on-chip precision oscillator as a time base;
   measuring the period of the on-chip non-precision oscillator as a function of the time base;
   determining from the measured period relative to the frequency of the on-chip precision oscillator the frequency of the non-precision oscillator;
   determining the difference between the determined frequency of the on-chip non-precision oscillator and a desired operating frequency of the on-chip non-precision oscillator;
   adjusting the frequency of the on-chip non-precision oscillator via a control input to said non-precision oscillator to minimize the determined difference; and
   when minimized, fixing the frequency of the non-precision oscillator to operate independent of the on-chip precision oscillator.

2. The method of claim 1, wherein the on-chip non-precision oscillator normally operates in an operating mode and the steps of measuring, determining and adjusting are carried out in a calibration mode different from the operating mode and further comprising the step of changing from the operating mode to the calibration mode in response to generation of a calibration signal.

3. The method of claim 2, wherein the on-chip precision oscillator is disabled when the on-chip non-precision oscillator is in the operating mode and is enabled when the operational mode is changed to the calibration mode.

4. The method of claim 2, wherein the on-chip non-precision oscillator operates in conjunction with a processing circuit and provides the time base therefor.

5. The method of claim 4, wherein the processing circuit operates in a first mode with the non-precision on-chip-oscillator providing the time base therefor when the on-chip non-precision oscillator is in the operating mode therefor, and the processing circuits in a second mode with the precision on-chip oscillator providing the time base therefor.

6. The method of claim 5, wherein the on-chip precision oscillator is disabled when the on-chip non-precision oscillator is in the operating mode and is enabled when the operational mode is changed to the calibration mode.

7. The method of claim 5, wherein the non-precision on-chip oscillator has a lower frequency than the precision on-chip oscillator.

* * * * *